US012784793B2

(12) United States Patent
Tankhilevich

(10) Patent No.: US 12,784,793 B2
(45) Date of Patent: Nov. 3, 2026

(54) MAGNETIC MEMORY BASED ON TUNABLE RUDERMAN-KITTEL-KASUYA-YOSIDA (RKKY) INTERACTION

(71) Applicant: Magtera, Inc., Walnut Creek, CA (US)

(72) Inventor: Boris G Tankhilevich, Walnut Creek, CA (US)

(73) Assignee: Magtera, Inc., Walnut Creek, CA (US)

( * ) Notice: Subject to any disclaimer, the term of this patent is extended or adjusted under 35 U.S.C. 154(b) by 876 days.

(21) Appl. No.: 17/881,440

(22) Filed: Aug. 4, 2022

(65) Prior Publication Data

US 2022/0375504 A1 Nov. 24, 2022

Related U.S. Application Data

(63) Continuation-in-part of application No. 17/853,059, filed on Jun. 29, 2022, which is a continuation-in-part (Continued)

(51) Int. Cl.
*G11C 11/00* (2006.01)
*G11C 11/16* (2006.01)
*H10N 50/10* (2023.01)

(52) U.S. Cl.
CPC ........... *G11C 11/161* (2013.01); *H10N 50/10* (2023.02)

(58) Field of Classification Search
CPC ... G11C 11/1675; G11C 11/161; G11C 11/16; G11C 11/5607; G11C 11/1695; G11C 13/06; G11C 11/22; G11C 2211/5615; G11C 2211/5616; G11C 11/06; G11C 13/0004; G11C 13/0061; G11C 13/0069;

(Continued)

(56) References Cited

U.S. PATENT DOCUMENTS 7,430,074 B2 9/2008 Korenblit et al.
7,471,449 B2 12/2008 Korenblit et al.

(Continued)

FOREIGN PATENT DOCUMENTS

CN 101512854 A 8/2009
CN 106252503 A 12/2016
CN 106896081 A 6/2017

OTHER PUBLICATIONS

Non-Final Office Action received for U.S. Appl. No. 17/509,501 dated Jun. 20, 2024, 39 pages.

(Continued)

*Primary Examiner* — Thong Q Le
(74) *Attorney, Agent, or Firm* — Boris G. Tankhilevich

(57) ABSTRACT

A memory cell comprising a first layer of magnetic metal; a Ruderman-Kittel-Kasuya-Yosida (RKKY) interaction spacer coupled to the first layer of magnetic metal; and a second layer of magnetic layer coupled to the RKKY spacer. The effective thickness of the RKKY spacer is changed by applied terahertz radiation resiling in changing the sign of RKKY interaction from a first sign of RKKY interaction to a second sign of RKKY interaction; thus, enabling an RKKY-tunable magnetic memory cell; wherein the first state of the memory corresponds to the first sign of RKKY interaction, and wherein the second state of the memory corresponds to the second sign of RKKY interaction.

9 Claims, 3 Drawing Sheets

Magnetic memory cell with Ruthenium (Ru) spacer (pinning layer)

Terahertz Magnon Laser invented by Magtera that can be used to irradiate spin valve of FIG. 1

Related U.S. Application Data of application No. 17/002,431, filed on Aug. 25, 2020, now Pat. No. 11,411,368, which is a continuation-in-part of application No. 16/704,090, filed on Dec. 5, 2019, now Pat. No. 10,790,635, and a continuation-in-part of application No. 16/245,224, filed on Jan. 10, 2019, now Pat. No. 10,892,602, and a continuation-in-part of application No. 16/245,247, filed on Jan. 10, 2019, now Pat. No. 10,804,671.

(58) Field of Classification Search

CPC ...... G11C 2013/0078; G11C 2013/008; G11C 2013/0092; G11C 13/04; H10B 61/22; H10B 61/00; H10B 61/10; H10N 50/10; H10N 50/01; H10N 50/80; H10N 50/85; H10N 30/204

See application file for complete search history.

(56) References Cited

U.S. PATENT DOCUMENTS

| | | | |
|---|---|---|---|
| 7,508,578 B2 | 3/2009 | Korenblit et al. | |
| 7,982,946 B1 | 7/2011 | Korenblit et al. | |
| 7,986,454 B1 | 7/2011 | Korenblit et al. | |
| 8,031,397 B1 | 10/2011 | Korenblit et al. | |
| 8,427,740 B1 | 4/2013 | Tankhilevich | |
| 9,132,451 B1 | 9/2015 | Tankhilevich | |
| 9,136,665 B1 | 9/2015 | Tankhilevich et al. | |
| 9,418,648 B1 | 8/2016 | Tankhilevich | |
| 9,847,374 B2 * | 12/2017 | Fukuzawa | G11C 11/161 |
| 2005/0024788 A1 | 2/2005 | Sato et al. | |
| 2006/0118839 A1 | 6/2006 | Sugahara et al. | |
| 2008/0002250 A1 | 1/2008 | Korenblit et al. | |
| 2009/0190264 A1 | 7/2009 | Fukuzawa et al. | |
| 2010/0033878 A1 | 2/2010 | Tsunekawa et al. | |
| 2012/0091548 A1 | 4/2012 | Sukegawa et al. | |
| 2012/0112299 A1 | 5/2012 | Inomata et al. | |
| 2015/0129946 A1 | 5/2015 | Annunziata et al. | |
| 2015/0162525 A1 | 6/2015 | Park et al. | |
| 2018/0175273 A1 | 6/2018 | Kashiwagi et al. | |

OTHER PUBLICATIONS

Examination Report received for Indian Patent Application Serial No. 202117035872 dated Mar. 7, 2022, 10 pages.

Examination Report received for Indian Patent Application Serial No. 202117035874 dated Mar. 28, 2022, 8 pages.

Notice of Allowance received for U.S. Appl. No. 17/002,431 dated Mar. 31, 2022, 38 pages.

Notice of Allowance received for U.S. Appl. No. 16/245,224 dated Apr. 14, 2020, 27 pages.

Notice of Allowance received for U.S. Appl. No. 16/704,090 dated May 26, 2020, 35 pages.

Notice of Allowance received for U.S. Appl. No. 16/245,247 dated May 27, 2020, 29 pages.

International Search Report and Written Opinion received for PCT Application Serial No. PCT/US2020/012985 dated Apr. 2, 2020, 18 pages.

Vilkov et al., "Generation of Terahertz Radiation Spectra by Radiation Sources Based on Solid-State Micro- and Nanostructures and Detection of Terahertz Spectra", DOI: 10.1134/S106422691809022X, Sep. 28, 2018, pp. 1015-1026.

Sulymenko et al., "Terahertz-Frequency Signal Source Based on an Antiferromagnetic Tunnel Junction ", DOI: 10.1109/LMAG.2018.2852291, Jul. 2, 2018, 5 pages.

Gulyaev et al., "Generation of Terahertz Radiation in Magnetic Junctions based on Nanowires." DOI: 10.1134/61063785019030271, May 6, 2019, pp. 271-273.

International Search Report and Written Opinion received for PCT Application Serial No. PCT/US2020/012229 dated Apr. 7, 2020, 19 pages.

International Search Report and Written Opinion received for PCT Application Serial No. PCT/US2020/012982 dated Apr. 20, 2020, 17 pages.

International Preliminary Report on Patentability received for PCT Application Serial No. PCT/US2020/012985 dated Jul. 22, 2021, 12 pages.

International Preliminary Report on Patentability received for PCT Application Serial No. PCT/US2020/012229 dated Jul. 22, 2021, 13 pages.

International Preliminary Report on Patentability received for PCT Application Serial No. PCT/US2020/012982 dated Jul. 22, 2021, 11 pages.

Non-Final Office Action received for U.S. Appl. No. 16/927,286 dated Feb. 15, 2022, 34 pages.

Non-Final Office Action received for U.S. Appl. No. 17/002,475 dated Apr. 25, 2022, 43 pages.

Examination Report received for Indian Patent Application Serial No. 202117035863 dated Mar. 29, 2022, 6 pages.

First Office Action received for Chinese Patent Application Serial No. 202080016918.9 dated Mar. 1, 2024, 11 pages (Including English Translation).

First Office Action received for Chinese Patent Application Serial No. 202080016949.4 dated Feb. 29, 2024, 14 pages (Including English Translation).

First Office Action received for Chinese Patent Application Serial No. 202080016908.5 dated Mar. 1, 2024, 19 pages (Including English Translation).

* cited by examiner

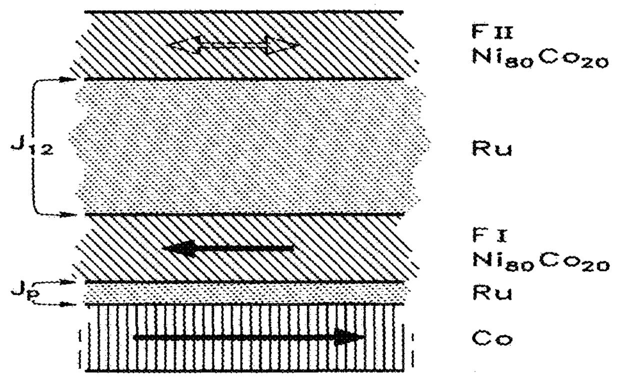
FIG. 1 illustrates a spin valve comprising two magnetic metals separated by RKKY spacer (normal metal)
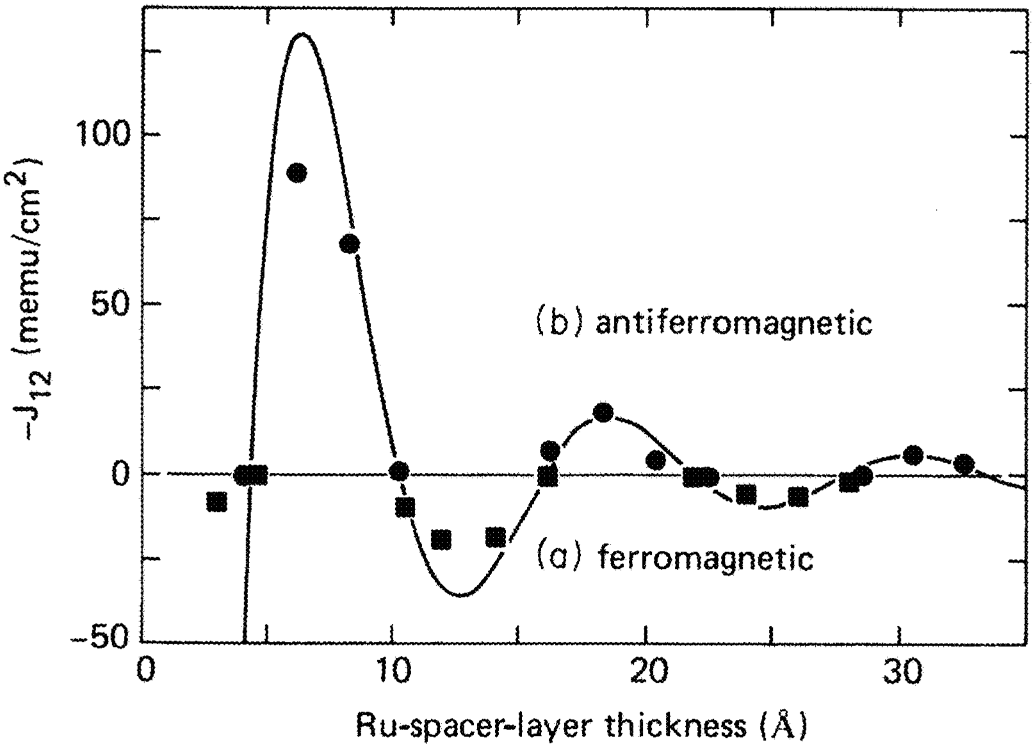
FIG. 2 shows the Interlayer exchange coupling strength $J_{1,2}$ for coupling of $Ni_{80}Co_{20}$ layers through a Ru spacer layer of spin valve of FIG. 1

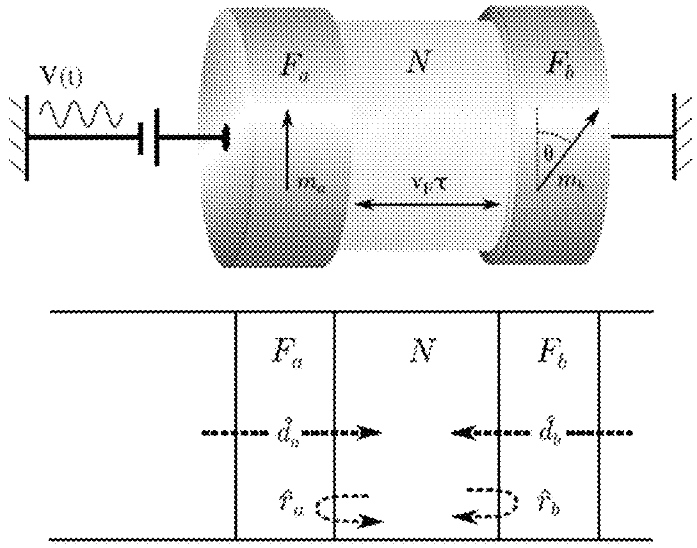
FIG. 3 depicts Spin Valve irradiated by terahertz radiation
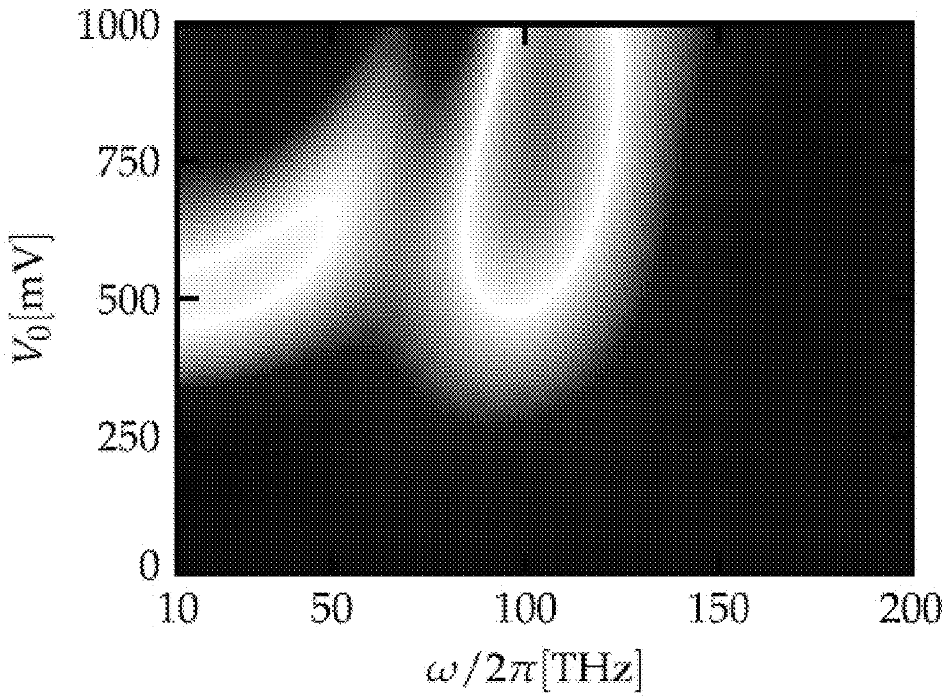
FIG. 4 illustrates how the THz Radiation can be indeed used to reverse the sign of RKKY interaction by increasing the bias voltage at fixed THz frequency: Red –antiferromagnetic, blue- ferromagnetic.

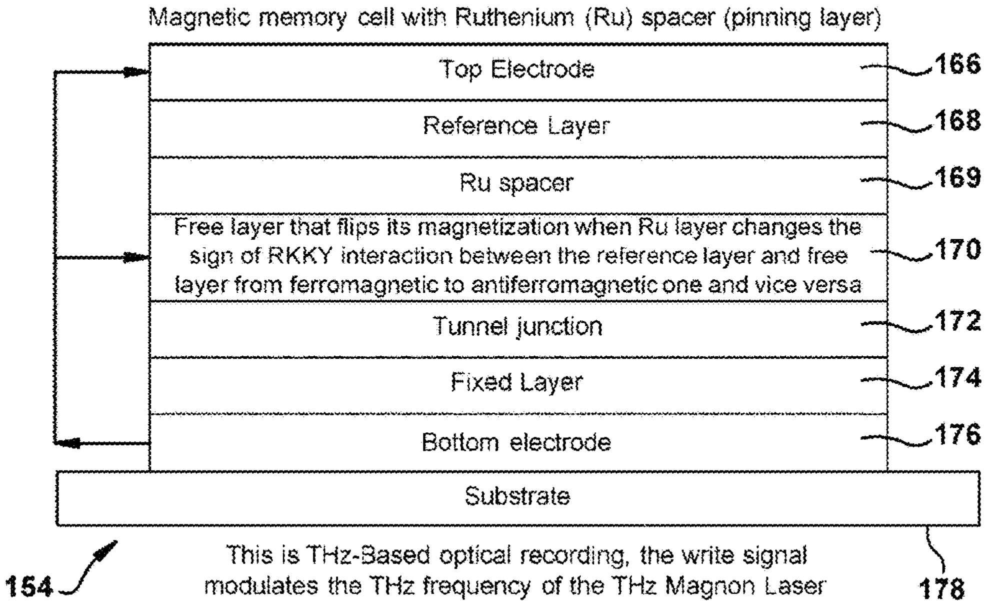
FIG. 5 Terahertz Magnon Laser invented by Magtera that can be used to irradiate spin valve of FIG. 1

MAGNETIC MEMORY BASED ON TUNABLE RUDERMAN-KITTEL-KASUYA-YOSIDA (RKKY) INTERACTION

CROSS REFERENCE TO RELATED APPLICATIONS

This application is a continuation-in-part of, and claims priority of the application Ser. No. 17/853,059, filed on Jun. 29, 2022, and titled "Apparatus and Method for terahertz-based reading of data recorded into RKKY (Ruderman-Kittel-Kasya-Yosida)-based magnetic memory without dissipation of energy in the medium".

This application is a continuation-in-part of, and claims priority of the application Ser. No. 17/002,431 filed on Aug. 25, 2020, and titled "Novel Technique of High-Speed Magnetic recording based on Manipulating pinning layer in Magnetic Tunnel Junction-based memory by using Terahertz Magnon Laser".

This application is a continuation-in-part of, and claims priority to, U.S. Pat. No. 10,790,635 "Technique of high-speed magnetic recording based on manipulating pinning layer in magnetic tunnel junction-based memory by using Terahertz Magnon Laser"; issued on Sep. 29, 2020.

This application is a continuation-in-part of, and claims priority of the U.S. Pat. No. 10,892,602 "Tunable multilayer Terahertz Magnon Generator" issued on Jan. 12, 2021

This application is a continuation-in-part of, and claims priority of the U.S. Pat. No. 10,804,671 "Terahertz Magnon Generator comprising plurality of single Terahertz Magnon Lasers" issued on Oct. 13, 2020.

The U.S. Pat. Nos. 10,790,635; 10,804,671 and 10,892,602 are assigned to Magtera, Inc.

The entireties of the foregoing patent and patent applications listed herein are hereby incorporated by reference.

TECHNICAL FIELD

The present disclosure relates to the field of magnon lasers employed to generate terahertz radiation.

BACKGROUND

Data centers represent the information backbone of an increasingly digitalized world. Demand for their services has been rising rapidly, and data-intensive technologies such as artificial intelligence, smart and connected energy systems, distributed manufacturing systems, and autonomous vehicles promise to increase demand further. Given that data centers are energy-intensive enterprises, estimated to account for around 1% of worldwide electricity use, these trends have clear implications for global energy demand and must be analyzed rigorously. Several often cited yet simplistic analyses claim that the energy used by the world's data centers has doubled over the past decade and that their energy use will triple or even quadruple within the next decade.

The data centers are becoming the biggest consumers of electricity world-wide. Indeed, data centers are among the highest consumers of electric power. Studies have shown that data center energy consumption continues to increase annually, with two identifiable trends.

The first trend is that mainstream legacy corporate data centers continue to be major consumers of power, despite many organizations migrating systems and hardware to cloud environments. But, while average use is increasing steadily, it's doing so at a lower rate than perhaps 20 years ago when cloud data centers were emerging as a major alternative to legacy facilities.

The other trend is that, while large cloud data centers, often called hyperscale centers, are steadily increasing their power usage, they're balancing that increase by investing in green initiatives, such as energy-efficient equipment. They're also revamping supporting systems such as HVAC, security and lighting.

The pecking order (a hierarchy of status) of memory and storage device is a critical component of various computer systems. Processor caches act as a subset of data and instructions stored in the memory. Data stored in the main memory are stored in large, slow storage devices, such as disks and flash. Data from modern applications such books, maps, photos, audios, videos, references, facts, and conversations rely on both real and offline processing and their dataset can be in gigabytes, terabytes, zettabytes or even larger in size.

Regrettably, the scaling of conventional memory technologies is at risk. Memory technologies, such as SRAM (Static Random Access Memory) and DRAM (Dynamic Random Access Memory), are experiencing scalability challenges as a result to the limitations of their device cell size and power dissipation.

Indeed, all current methods of writing and reading the data involve usage of an injected electrical current. This injected current after performing its memory function has to be dissipated into the recording medium.

SUMMARY

The present application discloses an apparatus and method for terahertz-based reading of data recorded in RKKY-based magnetic memory with negligible dissipation of energy in the medium because both the reading and writing operations are performed without sending electric current via the magnetic cell itself.

BRIEF DESCRIPTION OF THE DRAWINGS

The Figures can have the same, or similar, reference signifiers in the form of labels (such as alphanumeric symbols, e.g., reference numerals), and can signify a similar or equivalent function or use. Further, reference signifiers of the same type can be distinguished by appending to the reference label a dash and a second label that distinguishes among the similar signifiers. If only the first label is used in the Specification, its use applies to any similar component having the same label irrespective of any other reference labels. A brief list of the Figures is below.

FIG. 1 illustrates a spin valve comprising two magnetic metals separated by RKKY spacer (normal metal) for the purposes of the present technology.

FIG. 2 depicts RKKY interaction for the memory cell structure of FIG. 1 for the purposes of the present technology.

FIG. 3 shows a spin valve irradiated by terahertz radiation for the purposes of the present technology.

FIG. 4 illustrates how the THz Radiation can be indeed used to reverse the sign of RKKY interaction by increasing the bias voltage at fixed THz frequency (Red—antiferromagnetic, blue—ferromagnetic) for the purposes of the present technology.

FIG. 5 Terahertz Magnon Laser invented by Magtera that can be used to irradiate spin valve of FIG. 1) for the purposes of the present technology.

In the Figures, reference signs can be omitted as is consistent with accepted engineering practice; however, a skilled person will understand that the illustrated components are understood in the context of the Figures as a whole, of the accompanying writings about such Figures, and of the embodiments of the claimed inventions.

DETAILED DESCRIPTION

The Figures and Detailed Description, only to provide knowledge and understanding, signify at least one ECIN. To minimize the length of the Detailed Description, while various features, structures or characteristics can be described together in a single embodiment, they also can be used in other embodiments without being written about. Variations of any of these elements, and modules, processes, machines, systems, manufactures, or compositions disclosed by such embodiments and/or examples are easily used in commerce. The Figures and Detailed Description signify, implicitly or explicitly, advantages and improvements of at least one ECIN for use in commerce.

In the Figures and Detailed Description, numerous specific details can be described to enable at least one ECIN. Any embodiment disclosed herein signifies a tangible form of a claimed invention. To not diminish the significance of the embodiments and/or examples in this Detailed Description, some elements that are known to a skilled person can be combined for presentation and for illustration purposes and not be specified in detail. To not diminish the significance of these embodiments and/or examples, some well-known processes, machines, systems, manufactures, or compositions are not written about in detail. However, a skilled person can use these embodiments and/or examples in commerce without these specific details or their equivalents. Thus, the Detailed Description focuses on enabling the inventive elements of any ECIN. Where this Detailed Description refers to some elements in the singular tense, more than one element can be depicted in the Figures and like elements are labeled with like numerals.

A Spin Valve Comprising Two Magnetic Metals Separated by RKKY Spacer (Normal Metal).

FIG. 1 illustrates the RKKY-based memory cell for the purposes of the present technology. The exchange coupling, $J_{1,2}$ between two $Ni_{80}Co_{20}$ layers is measured by pinning the moment of one of the $Ni_{80}Co_{20}$ layers (F I) antiparallel to a Co layer. (S. S. P. Parkin et al., "*Spin engineering: Direct determination of the Ruderman-Kittel-Kasuya-Yosida Far-field range function in ruthenium Ru*". PHYSICAL REVIEW B VOLUME 44, NUMBER 13 1 Oct. 1991). The moment of the Co layer is set equal to the sum of the moments of the two $Ni_{80}Co_{2}$layers. This structure can be used as a memory cell for the purposes of the present technology.

If $J_{1,2}$ between two $Ni_{80}Co_{20}$ layers, as shown in FIG. 2, is 8 A., the sign of interaction between two $Ni_{80}Co_{20}$ layers is antiferromagnetic, and the overall magnetization of the magnetic cell comprising the sum of magnetizations of Co, and two $Ni_{80}Co_{20}$ layers is equal to magnetization of just Co as magnetizations of two $Ni_{80}Co_{20}$ layers cancel each other, that is bit '1' can be encoded in such magnetic memory cell configuration.

If, on the other hand, $J_{1,2}$ between two $Ni_{80}Co_{20}$ layers, as shown in FIG. 2, is 12 A, the sign of interaction between two $Ni_{80}Co_{20}$ layers is ferromagnetic, and the overall magnetization of the magnetic cell comprising the sum of magnetization of Co, and two $Ni_{80}Co_{20}$ layers is equal to zero, that is bit '0' can be encoded in such magnetic memory cell configuration.

Manipulating the Effective Thickness of RKKY Layer by Terahertz Radiation.

The RKKY-based memory can be achieved only if it is possible to effectively manipulate the thickness of the RKKY layer of the spin valve without changing its physical thickness. Theis can be done by using terahertz radiation. For the reference, please see "*Control of the Oscillatory Interlayer Exchange Interaction with Terahertz Radiation*", Uta Meyer e al., PRL 118, 097701 (2017) PHYSICAL REVIEW LETTERS week ending 3 Mar. 2017.

FIG. 3 shows a spin valve irradiated by terahertz radiation.

The physics of this effect is based on the idea that RKKY interaction can also be viewed as a scattering problem: the equilibrium spin current J flowing through the spacer N is simply related to the RKKY interaction: The characteristic time scale of the system is the time-of-flight $\tau$ through the normal spacer N whose thickness is $L_N$: $L_N = v_F \tau$; $v_F$ is Fermi velocity.

As shown in FIG. 4, THz radiation can be indeed used to reverse the sign of RKKY interaction by increasing the bias voltage at fixed THz frequency: Red—antiferromagnetic, blue—ferromagnetic In an embodiment of the present technology, FIG. 5 includes the Terahertz Mangion laser invented by Magtera, Inc. (U.S. Pat. No. 10,892,602 "Tunable multilayer Terahertz Magnon Generator").

In an embodiment of the present technology, by increasing the amplitude of the bias voltage at some at 10 THz from 250 mV to 750 mV (as shown in FIG. 4), we can change the sign of RKY interaction from ferromagnetic (blue color) to antiferromagnetic (9 red color at 500 mV) and back to ferromagnetic (blue color) at 750 mV.

A New Type of Magnetic Memory Based on Tunable Ruderman-Kittel-Kasuya-Yosida (RKKY) Interaction Thus, the spin valve comprising two magnetic metals separated by RKKY spacer (normal metal) of FIG. 1 becomes a memory cell based on terahertz-tunable RKKY interaction.

Indeed, the effective thickness of the RKKY layer can be changed by applying external terahertz radiation.

Therefore, we have a new type of magnetic memory based on tunable Ruderman-Kittel-Kasuya-Yosida (RKKY) interaction (RKKY-based memory cell) comprising: a first layer of magnetic metal; an RKKY spacer coupled to the first layer of magnetic metal; and a second layer of magnetic layer coupled to the RKKY spacer.

The effective thickness of the RKKY spacer is changed by applied terahertz radiation resulting in changing the sign of RKKY interaction from ferromagnetic to antiferromagnetic, or vice versa, thus enabling an RKKY-tunable magnetic memory cell.

In an embodiment of the present technology, the first state of such RKKY-based memory corresponds to the first sign of RKKY interaction, and wherein the second state of such RKKY-based memory corresponds to the second sign of RKKY interaction.

In an embodiment of the present technology, the first sign of RKKY interaction is selected from the group consisting of: a ferromagnetic sign of RKKY interaction; and an antiferromagnetic sign of RKKY interaction.

In an embodiment of the present technology, the second sign of RKKY interaction is selected from the group consisting of a ferromagnetic sign of RKKY interaction; and an antiferromagnetic sign of RKKY interaction.

In operation, a method for changing the sign of a Ruderman-Kittel-Kasuya-Yosida (RKKY) interaction in a RKKY-based memory cell comprises the following steps applying terahertz radiation to the RKKY-based memory cell by using Terahertz Magnon Laser; and changing a bias voltage applied to the Terahertz Magnon Laser.

The change of the bias voltage results in changing the sign of RKKY interaction from a first sign of RKKY interaction to a second sign of RKKY interaction; thus, enabling an RKKY-based magnetic memory cell; wherein the first state of such memory corresponds to the first sign of RKKY interaction, and wherein the second state of such memory corresponds to the second sign of RKKY interaction.

In an embodiment of the present technology, a method for changing the sign of a Ruderman-Kittel-Kasuya-Yosida (RKKY) interaction in a RKKY-based memory cell comprises the following steps: applying terahertz radiation to the RKKY-based memory cell by using Terahertz Magnon Laser; and changing amplitude of the generated terahertz radiation.

In an embodiment of the present technology, a method for changing the sign of a Ruderman-Kittel-Kasuya-Yosida (RKKY) interaction in a RKKY-based memory cell comprises the following steps: applying terahertz radiation to the RKKY-based memory cell by using Terahertz Magnon Laser; and tuning frequency of the generated terahertz radiation.

In an embodiment of the present technology; the amplitude of the generated terahertz radiation is changed by increasing the bias voltage near a first transition point (on FIG. 4 the first transition point lies at the border between the blue-coded and the red-coded areas of the diagram, at around 400 mV) from 400 mV to 500 mV to enable transition from a ferromagnetic sign of the RKKY interaction to an antiferromagnetic sign of said RKKY interaction.

In an embodiment of the present technology; the amplitude of the generated terahertz radiation is changed by increasing the bias voltage near a second transition point (on FIG. 4 the second transition point lies at the border between the red-coded and the blue-coded areas of the diagram, at around 600 mV) from 500 mV to 600 mV to enable transition from an anti-ferromagnetic sign of the RKKY interaction to a ferromagnetic sign of the RKKY interaction.

In an embodiment of the present technology; by applying a modulating voltage near the first transition point one can enable modulation of the RKKY interaction thus enabling recording the data encoded into the modulating voltage into the RKKY-based memory cell.

In an embodiment of the present technology; by applying a modulating voltage near the second transition point one can enable modulation of the RKKY interaction thus enabling recording the data encoded into the modulating voltage into the RKKY-based memory cell.

The above discussion has set forth the operation of various exemplary systems and devices, as well as various embodiments pertaining to exemplary methods of operating such systems and devices. In various embodiments, one or more steps of a method of implementation (calculating the optimum voltage bias, for example) are carried out by a processor under the control of computer-readable and computer-executable instructions. Thus, in some embodiments, these methods are implemented via a computer.

In an embodiment, the computer-readable and computer-executable instructions may reside on computer useable/readable media.

Therefore, one or more operations of various embodiments may be controlled or implemented using computer-executable instructions, such as program modules, being executed by a computer. Generally, program modules include routines, programs, objects, components, data structures, etc., that perform particular tasks or implement particular abstract data types. In addition, the present technology may also be practiced in distributed computing environments where tasks are performed by remote processing devices that are linked through a communications network. In a distributed computing environment, program modules may be located in both local and remote computer-storage media including memory-storage devices.

Although specific steps of exemplary methods of implementation are disclosed herein, these steps are examples of steps that may be performed in accordance with various exemplary embodiments. That is, embodiments disclosed herein are well suited to performing various other steps or variations of the steps recited. Moreover, the steps disclosed herein may be performed in an order different than presented, and not all of the steps are necessarily performed in a particular embodiment.

Although various electronic and software-based systems are discussed herein, these systems are merely examples of environments that might be utilized and are not intended to suggest any limitation as to the scope of use or functionality of the present technology. Neither should such systems be interpreted as having any dependency or relation to any one or combination of components or functions illustrated in the disclosed examples.

Although the subject matter has been described in a language specific to structural features and/or methodological acts, the subject matter defined in the appended claims is not necessarily limited to the specific features or acts described above. Rather, the specific features and acts described above are disclosed as exemplary forms of implementing the claims.

What is claimed is:

1. An apparatus comprising:
- a first layer of magnetic metal;
- a Ruderman-Kittel-Kasuya-Yosida (RKKY) interaction spacer coupled to said first layer of magnetic metal; and
- a second layer of magnetic layer coupled to said RKKY spacer;
- wherein the effective thickness of said RKKY spacer is changed by applied terahertz radiation resiling in changing the sign of RKKY interaction from a first sign of RKKY interaction to a second sign of RKKY interaction; thus, enabling an RKKY-tunable magnetic memory cell;
- wherein the first state of said memory corresponds to said first sign of RKKY interaction, and
- wherein the second state of said memory corresponds to said second sign of RKKY interaction, and
- wherein said sign of RKKY interaction is changed by applying tunable terahertz signal generated by Terahertz Magnon Laser.

2. An apparatus comprising:
- a first layer of magnetic metal;
- a Ruderman-Kittel-Kasuya-Yosida (RKKY) interaction spacer coupled to said first layer of magnetic metal; and
- a second layer of magnetic layer coupled to said RKKY spacer;
- wherein the effective thickness of said RKKY spacer is changed by applied terahertz radiation resiling in changing the sign of RKKY interaction from a first sign of RKKY interaction to a second sign of RKKY interaction; thus, enabling an RKKY-tunable magnetic memory cell;

wherein the first state of said memory corresponds to said first sign of RKKY interaction, and wherein the second state of said memory corresponds to said second sign of RKKY interaction and wherein said sign of RKKY interaction is changed by applying tunable terahertz signal generated by Terahertz Magnon Laser; and wherein said Terahertz Magnon Laser further comprises:

a spin injector; said spin injector comprising a source of minority electrons having spin down;

a tunnel junction coupled to said spin injector;

and a bottom layer further comprising a ferromagnetic material coupled to said tunnel junction; said ferromagnetic material including a Magnon Gain Medium; said ferromagnetic material further comprising:

a conduction band that is split into two sub bands separated by an exchange energy gap, a first sub band having spin up directed along the magnetization of said ferromagnetic material; and a second sub band having spin down directed opposite to the magnetization of said ferromagnetic material; wherein majority electrons having spin up are located in said first sub band having spin up;

wherein said minority electrons having spin down are injected into said Magnon Gain Medium from said spin injector by tunneling via said tunnel junction after a bias voltage is applied to said spin injector; and wherein said applied bias voltage is configured to shift the Fermi level of said spin injector with respect to the Fermi level of said ferromagnetic material.

3. A method for changing the sign of a Ruderman-Kittel-Kasuya-Yosida (RKKY) interaction in a RKKY-based memory cell comprising a first layer of magnetic metal; a Ruderman-Kittel-Kasuya-Yosida (RKKY) interaction spacer coupled to said first layer of magnetic metal; and a second layer of magnetic layer coupled to said RKKY spacer; said method comprising:

(A) applying terahertz radiation to said Ruderman-Kittel-Kasuya-Yosida (RKKY) interaction spacer by using Terahertz Magnon Laser;

and (B) changing a bias voltage applied to said Terahertz Magnon Laser;

wherein change of said bias voltage results in changing the sign of RKKY interaction from a first sign of RKKY interaction to a second sign of RKKY interaction; thus, enabling an RKKY-tunable magnetic memory cell; wherein the first state of said memory corresponds to said first sign of RKKY interaction, and wherein the second state of said memory corresponds to said second sign of RKKY interaction.

4. The method of claim 3, wherein said step (B) further comprises:

(B1) changing amplitude of said generated terahertz radiation.

5. The method of claim 3, wherein said step (B) further comprises:

(B2) tuning frequency of said generated terahertz radiation.

6. The method of claim 4, wherein said step (B1) further comprises:

(B1; 1) changing said amplitude of said generated terahertz radiation near a first transition point to enable transition from a ferromagnetic sign of said RKKY interaction to an antiferromagnetic sign of said RKKY interaction.

7. The method of claim 4, wherein said step (B1) further comprises:

(B1; 2) changing said amplitude of said generated terahertz radiation near a second transition point to enable transition from an antiferromagnetic sign of said RKKY interaction to a ferromagnetic sign of said RKKY interaction.

8. The method of claim 4, wherein said step (B1) further comprises:

(B1; 3) applying a modulating voltage bias signal to said Terahertz Magnon Laser near said first transition point to enable modulation of said RKKY interaction thus enabling recording the data encoded into said modulating voltage into said RKKY-based memory cell.

9. The method of claim 4, wherein said step (B1) further comprises:

(B1; 4) applying a modulating voltage bias signal to said Terahertz Magnon Laser near said second transition point to enable modulation of said RKKY interaction thus enabling recording the data encoded into said modulating voltage into said RKKY-based memory cell.

* * * * *